United States Patent [19]

Yamada et al.

[11] Patent Number: 4,849,196

[45] Date of Patent: Jul. 18, 1989

[54] PROCESS FOR PRODUCING SILICON CARBIDE WHISKERS

[75] Inventors: Motoyuki Yamada; Akira Hayashida; Kazutoshi Numanami; Takahiro Iizuka, all of Joetsu, Japan

[73] Assignee: Shin-Etsu Chemical Co., Ltd., Tokyo, Japan

[21] Appl. No.: 137,830

[22] Filed: Dec. 23, 1987

[30] Foreign Application Priority Data

Dec. 23, 1986 [JP] Japan .................................. 61-310407

[51] Int. Cl.$^4$ .............................................. C01B 31/36
[52] U.S. Cl. .................................... 423/345; 423/346
[58] Field of Search ............................... 423/345, 346

[56] References Cited

FOREIGN PATENT DOCUMENTS

| 166212 | 8/1985 | Japan | 423/345 |
| 239315 | 11/1985 | Japan | 423/345 |
| 1022000 | 1/1986 | Japan | 423/346 |
| 2116533 | 9/1983 | United Kingdom | 423/345 |

*Primary Examiner*—Robert L. Stoll
*Assistant Examiner*—Lori S. Freeman
*Attorney, Agent, or Firm*—Jules E. Goldberg

[57] ABSTRACT

The present invention provides a process for producing silicon carbide whiskers by reacting a starting mixture comprising starting silicon source material mainly composed of silicon and oxygen and carbonaceous material at a high temperature, wherein one or more of Fe, Co and Ni ingredients are contained in the starting mixture such that the total amount of the Fe, Co, Ni ingredients is from 25 to 2000 ppm based on the silicon ingredient in the starting silicon source material. Silicon carbide whiskers at high purity can be produced at high yield with less content of powdery silicon carbide.

13 Claims, No Drawings

PROCESS FOR PRODUCING SILICON CARBIDE WHISKERS

BACKGROUND OF THE INVENTION

1. Field of the Invention

The present invention concerns a process for producing silicon carbide whiskers at high yield, at a reduced cost, with less content of powdery silicon carbide and at high purity.

2. Description of the Prior Art

Since silicon carbide whiskers are excellent in the strength, modulus of elasticity, oxidation resistance, heat resistance and chemical stability as compared with other fibers for use in composite materials, they have attracted attention as composite reinforcing material for ceramics, metals and plastics and, particularly, as composite reinforcing material for metals because they have satisfactory wettability with various kind of metals.

The production process for such silicon carbide whiskers is generally classified into (A) a method of depositing from liquid silicon carbide at high temperature and high pressure, (B) a method of dissolving carbon into a molten liquid of metal silicon and crystallizing silicon carbide, (C) a method of crystallizing by sublimating silicon carbide at high temperature from silicon carbide powder and (D) a method of growing crystals of silicon carbide formed by the heat decomposing reaction of silicon compounds.

Among them, the methods (A) and (B), however, result in a great difficulty in the production in view of the production facility because of the use of extremely high temperature and high pressure or the use of molten metal liquid. Further, the method (C) also requires an extremely high operation temperature and can not be operated with ease, as well as the facilities are complicated and fractional collection of the resultant whiskers is difficult. Accordingly, all of the methods (A) to (C) have fetal defects as the industrial production process.

Accordingly, the method (D) as above in which silicon carbide is deposited in the form of whiskers while forming silicon carbide by various heat decomposing reactions is predominant at present as the process for producing silicon carbide and various methods have further been proposed therefor. That is, as the method (D), there have been known (1) a method of conducting solid phase reduction for silicon dioxide with carbon or metal silicon and carbon, (2) a method of reacting an organic silicon compound or a mixture of a silicon compound and a carbonaceous compound in a gaseous form at high temperature and (3) a method of gas phase growing utilizing the reaction between a fluorine-containing silicate and carbon.

Among them, the method (2) only produces extremely small amount of silicon carbide whiskers per unit volume of the reaction chamber since the reaction is conducted in a gas phase with a large volume of the chamber, requires to maintain the inside of the large capacity reaction chamber at a high temperature upon production in an industrial scale since the reaction is conducted at high temperature, resulting in high cost, as well as involves a problem that corrosive reaction by-products are formed. Furthermore, in the method (3), a fluorine-containing silicate is melted and reducing reaction with carbon added thereto is taken place and evolved vapors are cooled to form silicon carbide whiskers. Also the method (3) involves the same problems as that for the method (2) above in view of the utilization of gas phase reaction. Moreover, since the method (3) is necessary to handle a great amount of molten salt, it brings about problems that the material for the production facility is limited severely, and these molten salts are incorporated as impurity to the produced silicon carbide whiskers. Therefore, the method (3) is not preferable as the industrial production process for the silicon carbide whiskers.

While on the other hand, in the method of utilizing the solid phase reduction (1) above, most easily available silicon dioxide is used as the starting material and it can be classified into two types depending on the reaction scheme.

① A process for producing silicon carbide whiskers by using silicon dioxide and carbon as the starting material by the following reaction:

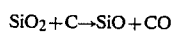

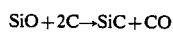

That is, fundamentally by the same method as the Acheson's method generally known as the industrial production process for silicon carbide.

② A production process by using silicon dioxide, metal silicon and carbon as the starting material by the reaction of:

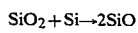

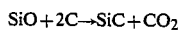

Among them, it is essential in the process ② to at first prepare silicon monoxide by the reaction of silicon dioxide and metal silicon. Accordingly, it is necessary, for example, as disclosed in Japanese Patent Publication No. Sho 47-18531 to preferentially conduct the reaction of forming silicon monoxide at first by silicon dioxide and metal silicon while avoiding the contact between silicon dioxide and carbon so that no unreacted metal silicon remains, for example, by a method of disposing a carbon or graphite substrate at a place apart from the portion of forming silicon monoxide. Accordingly, the process ② inevitably increases the capacity of the production facility and, also brings about defect of resulting in the reduction of the yield.

While on the other hand, the process ① is free from the defect in the process ② described above and it is advantageous as the industrial production process since it can be conducted by merely mixing silicon dioxide and carbon uniformly and heating the mixture to a predetermined temperature.

In connection with the process ①, various studies have been made also to the starting silicon source material for producing silicon carbide whiskers by the process ① and there have been known, for example, (a) a method of using silicon component present in hulls of gramineous plants, (b) a method of using silica sand as the starting material, (c) a method of using silas or glass dust as the starting material, (d) a method of using active silica with high specific surface area such as silica sol and silica gel as the starting material, etc.

However, the method (a) involves a drawback that hulls as the starting material have to be applied with pre-treatment of carbonizing or ashfying hulls and, in addition, a large-scaled hull processing facility is required since the silicon content of hulls is less than 20% by weight. Further, availability of hulls as the starting material is liable to suffer from the effects depending on the season and climate conditions and many impurities are incorporated into the silicon carbide whiskers produced. Further, the method (b) requires a step of previously pulverizing silica sands finely and the silica sands, being crystalline substance, show poor reactivity and results in lower yield as compared with amorphous silicic source starting material. The method (c) brings about problems that metal impurities other than silicon contained in the starting material may be incorporated into silicon carbide whiskers, or impurities are gasified and scattered in the heating step of the starting material, which are solidified by coagulation at the low temperature portion of the reaction chamber to hinder the continuous operation. The method (d) also involves problems that silica is expensive as the starting silicon source material, can provide no high reactivity as expected since the silica shrinks at high temperature and changes into deactivated silica with low specific surface area at the reaction temperature and, accordingly, provides no good yield. Therefore, it is difficult to provide silicon carbide whiskers with less impurity content at a high yield by using any one of starting silicon source materials (a) to (d).

Further, it has recently been disclosed a process for producing silicon carbide whiskers by using a hydrolyzable silicon compound as the starting silicon source material, admixing the hydrolyzable silicon compound and a carbon compound into a steam-containing hot gas, thereby forming a mixed aerosol of silicon oxide and carbon and producing silicon carbide whisker by using the mixed aerosol as the starting material (Japanese Patent Laid-Open No. Sho 60-16809 and Japanese Patent Publication No. Sho 61-2640). However, the process is disadvantageous in that the mixed aerosol formed by the process is extremely fine and of low bulk density to render the handling difficult, reduce the charging amount of the starting material per unit volume and worsen the productivity.

Furthermore, in the process ① above, various attempts have been made for other materials than the starting silicon source material and the following improvement has also been proposed for the method of using the starting silicon source materials (b) to (d) described above.

(i) A method of incorporating chlorine or hydrogen chloride, easily evaporizable hydrocarbon or halogenated hydrocarbon as a carbon source, etc. into an atmosphere for improving the reaction rate (Japanese Patent Publication No. Sho 52-28757 and U.S. Pat. No. 3933984).

(ii) A method of adding, as VLS catalyst, powder of metals such as Fe, Co, Ni, B, La, Mn, Al, Ti, etc. or the compounds thereof to a mixture of silicon dioxide and carbon and, further, using vapors of sodium chloride as the space-forming agent (U.S. Pat. No. 3622272, Japanese Patent Publication Nos. Sho 51-8760, 59-45637 and 60-44280 and Japanese Patent Laid-Open No. Sho 61-22000).

However, the method (i) involves a problems in using corrosive gases and the method (ii) involves problems in that it uses a great amount of the VLS catalyst and further uses sodium chloride, as the space-forming agent. Accordingly, the catalyst and sodium chloride are introduced as impurities to silicon carbide whiskers in the production step thereof to reduce the purity, thus bringing about the reduction in the wettability and adhesion between the resulting whiskers and the matrix, as well as reduction in the toughness of the whiskers.

Further, in any of the processes ① as described above, there is a high possibility that a great amount of powdery silicon carbide is by-produced together with the amied silicon carbide whiskers. Although the size and the content of the powdery silicon carbide vary depending on the whisker forming conditions, the powdery silicon carbide is by-produced while being broadly dispersed in the whiskers. When the whisker containing such by-products are composited with metals or plastics, the substantial whisker content composited is low and no expected compositing effect can be obtained. In addition, the strength of the composite material is rather reduced due to large grain size of granular or finely powderous product. Accordingly, the silicon carbide whiskers containing a great amount of powdery silicon carbide are often not suitable as composite reinforcing material for ceramics, metals and plastics. Furthermore, there has been a problem that the powdery products by-produced in the silicon carbide whiskers can not completely be separated even by the separation method utilizing the difference in the oleophilic and hydrophilic properties or by means of centrifugal precipitation.

In view of the foregoing situations, the present inventors have made earnest studies on the process for producing silicon carbide whiskers by improving the method (1) and, particularly, the process ① and have proposed a process of mixing a hydrolysis product of chlorosilane or chlorodisilane as the starting silicon source material with a carbonaceous material and reacting them at a high temperature from 1400° to 1700° C. (Japanese Patent Application Nos. Sho 60-26687 and Sho 61-53243). Although it is possible to produce silicon carbide whiskers at a yield as high as 80% or more, a further improvement is still required for suppressing the content of the by-produced powdery silicon carbide and reducing metal impurity.

SUMMARY OF THE INVENTION

It is an object of the present invention to provide a process capable of producing silicon carbide whiskers excellent in view of purity, yield, productivity, operationability, production facility and cost and, particularly, capable of producing silicon carbide whiskers with less content of powdery silicon carbide, at high purity and at a reduced cost.

As a result of the earnest study for attaining the foregoing purpose, the present inventors have made various studies on the conditions for producing silicon carbide whiskers excellent in yield, productivity, operationability, etc. while minimizing the incorporation of the impurity into the silicon carbide whiskers and suppressing the formation of powdery products (by-production of powdery silicon carbide) and, as a result, have found that necessary and sufficient conditions for forming the whiskers can be provided in a process for producing silicon carbide whiskers by reacting a mixture of starting silicon source material mainly composed of silicon and oxygen and carbonaceous material at a high temperature, based on the method (1) of the solid phase reduction, particularly, the process ① above, wherein one or more compounds of Fe, Co and Ni are added or adjusted as required such that the total amount of Fe, Co and Ni contents in the starting reaction material within a range from 25 to 2000 ppm based on the silicon ingredient in the starting silicon source material mainly composed of silicon and oxygen. More specifically, in the course of the attempt for the production of silicon carbide whiskers from various starting materials, it has been found that no whisker silicon carbides is formed at all in the case of using extremely pure silica gel or carbon as shown in Table 2, as well as that the growth of whisker is promoted as the content of specific impurity is increased and that there is a relationship between the content of the impurity metal in the starting material and content in the whisker. Upon studying various VLS catalysts and the concentrations based on the above result, it has been found that silicon carbide whiskers at high purity with no substantial powdery product can be obtained in the case of using such a starting material in which the total amount of Fe, Co and Ni contents in the starting reaction material within a range from 25 to 2000 ppm, preferably, from 25 to 750 ppm based on the silicon ingredient in the starting silicon source material mainly composed of silicon and oxygen. The present invention has been completed on the above findings.

The use of the Fe, Co and Ni ingredients as the catalyst for the production of silicon carbide whiskers has been well known. From since it had been reported by L. Patric et al. that Cr, Al, Fe, Co, Cu, Si and Au are effective as the catalyst of VLS mechanisms for the production of the silicon carbide whiskers (Physical Review, 143, 526 (1966)), various studies have been made for these metals or metal compounds and, further, various metals and metal compounds mainly for Ni or like other transition metals. However, the amount of Fe, Co and Ni ingredient used has not been specifically disclosed so far and most of the relevant reports described the use of them in a great amount exceeding 2000 ppm and, thus, Fe, Co and Ni have been used in a great amount.

In this regard, although Japanese Patent Publication No. Sho 50-18479 describes a method of using a small amount of catalyst, the method belongs to the method (1)-②  above, that is fundamentally different from the method (1)-①, to which the present invention belongs. Then referring further to the reaction method, a catalyst is added to a mixture of Si and SiO$_2$ and graphite powder is covered over the mixture. In addition, the object of the catalyst effect is to improve the rate of forming SiO from Si+SiO$_2$ and, as a result, increase the entire reaction rate but it shows nothing for the whisker growing effect as the VLS catalyst. Further, although Japanese Patent Laid-Open No. Sho 61-22000 also suggests the use of a small amount of catalyst, the amount of the catalyst actually used in the examples is extremely great such as Fe/Si=17,000 ppm and, in addition, use of a halogenated alkali metal or alkaline earth metal is essential as the co-catalyst in this process.

Accordingly, in the case of producing silicon carbide whiskers in accordance with the method (1)-① by reacting a starting mixture comprising a starting silicon source material mainly composed of silicon and oxygen and a carbonaceous material at high temperature, it is a novel finding made by the present inventors that silicon carbide whisker at high purity with less powdery products can be obtained at a good yield by using Fe, Co and Ni only in a restricted amount instead of using them in a great amount as usual, specifically, by using them in an amount from 25 to 2000 ppm, particularly, from 25 to 750 ppm based on the silicon ingredient in the starting silicon material.

Therefore, the present invention provides a process for producing silicon carbide whiskers by reacting a starting mixture comprising a starting silicon source mainly composed of silicon and oxygen and a carbonaceous material at a high temperature, said starting mixture containing one or more of Fe, Co and Ni ingredients such that the total amount of the Fe, Co and Ni ingredients is from 25 to 2000 ppm based on the silicon ingredient in the starting silicon source material.

The other objects, features and advantages of the present invention will be more apparent from the following description.

DETAILED DESCRIPTION OF THE INVENTION

The starting silicon source materials usable in the process according to the present invention has no particular restrictions so long as they are mainly composed of silicon and oxygen and various materials such as silica gel can be used. In this case, the rate of silicon and oxygen may preferably be $0.5 \leq O/Si \leq 2$. However, in view of the yield of the silicon carbide whiskers produced and suppression for the content of powdery silicon carbide, those preferred are gel-like anhydrous silicic acid obtained by adding an inorganic acid to a silicate, hydrolysis products of one or more of silanes selected from chlorosilanes represented by the general formula:

$$R_a SiCl_{4-a}$$

where R represents a hydrogen atom, a monovalent hydrocarbon group having 1 to 4 carbon atoms, phenyl group or vinyl group and a is an integer of 0-3, and chlorodisilanes represented by the general formula:

$$R_b Si_2 Cl_{6-b}$$

where R represents a hydrogen atom, a monovalent hydrocarbon group having 1 to 4 carbon atoms, phenyl group or vinyl group and b is an integer of 1-5, or hydrolysis products of one or more of silanes selected from alkoxysilanes represented by the general formula:

$$R_a Si(OR')_{4-a}$$

where R represents a hydrogen atom, a monovalent hydrocarbon group having 1 to 4 carbon atoms, phenyl group or vinyl group, R' represents a monovalent hydrocarbon group having 1 to 4 carbon atoms and a is an integer of 0-3, and alkoxydisilanes represented by the general formula:

$$R_b Si_2 (OR')_{6-b}$$

where R represents a hydrogen atom or a monovalent hydrocarbon group having 1 to 4 carbon atoms, phenyl group or vinyl group, R' represents a monovalent hydrocarbon group having 1 to 4 carbon atoms and b is an integer of 1-5.

The gel-like anhydrous silicic acid can be obtained by adding and reacting an inorganic acid such as hydrochloric acid or sulfuric acid to a silicate such as sodium silicate or calcium silicate and then water washing and drying them. In this case, since metal impurities contained in the silicate are dissolved with the inorganic acid and removed by water washing, no substantial Fe, Co and Ni ingredients are contained in the resultant gel-like anhydrous silicic acid and it can provide a merit suitable to the concentration control of the Fe, Co and Ni ingredients in the case of use as the starting silicon source material.

The chlorosilanes used in the case of obtaining the decomposition products of the silanes can include, for example, $CH_3SiCl_3$, $(CH_3)_2SiCl_2$, $(CH_3)_3SiCl$, $(CH_2=CH)SiCl_2$, $C_6H_5SiCl_3$, $HSiCl_3$, $H_2SiCl_4$, etc. They may be prepared by direct reaction between an organic chloride such as methyl chloride and metal silicon for obtaining $(CH_3)_2SiCl_2$, $CH_3SiCl_3$, etc. as the starting material in the silicone industry or as by-product therein, prepared by direct reaction between hydrogen chloride and metal silicon for synthesizing trichlorosilane $(HSiCl)_3$ used as the main starting material in the semiconductor industry or $H_2SiCl_2$, $SiCl_4$, etc. obtained as by-products thereof. They may be also prepared by disproportionation reaction of trichlorosilane, or reducing hydrogenation of $SiCl_4$ with lithium aluminum hydride. Further, the chlorodisilanes can include, for example, $(CH_3)Si_2Cl_5$, $(CH_3)_2Si_2Cl_4$, $(CH_3)_3Si_2Cl_3$, $(C_6H_5)_3Si_2Cl_3$, etc. They are contained in a great amount in the ingredients by-produced as high boiling fractions upon direct synthesis of the chlorosilanes described above and since they have been discarded so far as can not be used per se as the starting material in the silicone industry, they can be available at a reduced cost and easily. They may be also prepared by heat decomposition and chlorination of polymethylsilane. Since various kinds of chlorosilanes or chlorodisilanes can be obtained in which the value a ranges from 0–3 and values b ranges from 1 to 5 in the general formulaes described above, those containing the silicon atoms and carbon atoms at a desired ratio can be obtained with ease by properly combining them. The chlorosilanes and chlorodisilanes usually contain Fe, Co and Ni ingredients as well as other metal impurities, and such metal impurities can be removed by means of simple distillation or distillating purification prior to using them for obtaining the starting silicon source material in view of the concentration control for the Fe, Co and Ni ingredient therein.

The alkoxysilanes and the alkoxydisilanes may be those alkoxysilanes such as alcoholic decomposing product of the chlorosilanes or the chlorodisilanes as described above or those alkoxy silanes prepared by the direct reaction between an alcohol and metal silicon. Similar to the case of the chlorosilanes or chlorodisilanes, the metal impurities can be removed by the simple distillation or distillating purification prior to the use for obtaining the starting silicon source material in view of the concentration control for the Fe, Co and Ni ingredients therein.

The hydrolysis products of the silanes used as the starting silicon source material can be prepared with ease by direct contact of gas or liquid of the chlorosilanes, chlorodisilanes, alkoxysilanes or alkoxydisilanes with water. In this way, the chlorosilanes or chlorodisilanes are readily hydrolyzed in which the $\equiv Si-Cl$ bond is converted into $\equiv Si-O$ bond and they are formed into hydrolysis product mainly composed of silicon and oxygen. Further, the alkoxysilanes or alkoxydisilanes are also hydrolyzed easily in which the $\equiv Si-OR'$ bond is converted by way of $\equiv Si-OH$ bond into $\equiv Si-O-Si\equiv$ bond and into a hydrolysis product mainly composed of silicon and oxygen. The thus obtained hydrolysis product is sent to the subsequent step after pH adjustment and drying as required. If the number of the bond hydrogen atoms and/or bond monovalent hydrocarbon groups per one silicon atom (R/Si) in the hydrolysis product is greater than 2.0, the hydrolysis product may sometime converted into siloxanes to evaporate the Si component under heating in the subsequent step to reduce the yield of the aimed silicon carbide whiskers. It is thus desirable that the ratio is set to the range of R/Si=0–2.0, preferably, 0–1.75. In view of the above, it is desirable to adjust the addition amount of the chlorosilanes, chlorodisilanes, alkoxysilanes or alkoxydisilanes such that the R/Si ratio falls within the above specified range upon hydrolysis. The hydrolysis products contain $\equiv Si-H$ bond, $\equiv Si-C$ bond and $\equiv Si-Si\equiv$ bond, which are stable at the ambient temperature but readily decomposed in a high temperature reaction range as for producing silicon carbide whiskers to form and scatter decomposed gases such as hydrogen or methane, by which remaining silicon atoms become highly active and can contribute to the improvement of the yield for the silicon carbide whiskers.

As the carbonaceous material used in the process according to the present invention, it is possible to use any of those carbon blacks such as acetylene black and furnace black, those composed of carbon ingredients such as activated carbon and charcoal and those that can easily be carbonized by heating such as phenol resins. In the case of using those composed of carbon ingredient as the carbonaceous material, powdery material is preferably used.

The starting mixture comprising the starting silicon source material and the carbonaceous material described above can be obtained by the known method such as by mixing them in a V-type mixer or paddle type mixer and both of them are preferably mixed sufficiently in view of the improvement in the yield. Thus, in the case of using the gel-like anhydrous silicic acid as the starting silicon source material, it is preferred to obtain a starting mixture comprising the starting silicon source material and the carbonaceous material by uniformly mixing a silicate and the carbonaceous material and then adding an inorganic acid to the uniform mixture, thereby converting the silicate in the mixture into a gelified anhydrous silicic acid. Further, in the case of using the hydrolysis products as the starting silicon source material, it is preferred to obtain a starting mixture comprising the starting silicon source material and the carbonaceous material by adding water containing carbonaceous material uniformly dispersed therein to chlorosilanes, chlorodisilanes, alkoxysilanes or alkoxydisilanes as the starting material for the hydrolysis product thereby forming hydrolysis products.

In the process according to the present invention, one or more of the Fe, Co and Ni ingredients are contained in the starting mixture such that the total amount of the Fe, Co and Ni ingredients is within a range from 25 to 2000 ppm, preferably, from 25 to 750 ppm based on the silicon ingredient in the starting silicon source material.

In this case, if the total amount of the Fe, Co, Ni ingredients is lower than 25 ppm, the yield is rapidly reduced along with the reduction in the total amount and the content of the powdery silicon carbide is extremely increased and most portion of the resultant products becomes powdery silicon carbide, thereby causing a result that the silicon carbide whiskers are not substantially formed with the total content, for example, of about 5 ppm. While on the other hand, if the total amount exceeds 2000 ppm, the catalyst effect of the Fe, Co, Ni ingredients is rather reduced. In fact, increase in the content of the powdery silicon carbide and reduction in the yield will occur along with the increase in the total amount. Moreover, the increase in the catalyst addition amount causes undesired effect of increasing the impurity content in the silicon carbide whiskers. In either of the cases, the resultant silicon carbide whiskers are less available as the composite reinforcing material for ceramics, metal and the plastics.

In view of the content in the earth crust, these Fe, Co and Ni ingredients are always found in industrial starting materials applied with no particular purification and, accordingly, the starting mixture comprising the starting silicon source material and the carbonaceous material used in the process according to the present invention usually contain a considerable amount of Fe, Co and Ni ingredients and their content is taken into consideration as the measure for the total amount. That is, if the total amount of the ingredients is less than 25 ppm, it is necessary to add one or more of the Fe, Co and Ni ingredients such that they can reach the range of the content as described above. While on the other hand, if it exceeds 2000 ppm, it is necessary to remove a portion of these ingredients by physical or chemical means such that it falls within the range of the content as described above. Usually, the former case is often encountered and the catalyst is added so as to attain an aimed concentration to the starting material containing Fe, Co and Ni ingredient at a relatively low concentration in most cases.

In this case, as the Fe, Co and Ni ingredients to be supplied externally, metals, alloys or various compounds such as oxides, halides, sulfates, nitrates, phosphates, etc. of Fe, Co and Ni may be used. Among them, water-soluble salts of Fe, Co and Ni are most preferred. In the process according to the present invention, it is particularly desirable that the Fe, Co and Ni ingredients are uniformly distributed to the starting silicon source material in view of the improvement in the yield of the silicon carbide whiskers or suppression of the by-production of powdery silicon carbides. It is, accordingly, suitable that the Fe, Co and Ni ingredients are used in a liquid state. In the case of treating the starting silicon source material or a starting mixture prepared by adding the carbonaceous material thereto with a solution of the Fe, Co and Ni ingredients, the Fe, Co and Ni ingredients can uniformly be applied to the surface of the starting material to obtain silicon carbide whiskers at high yield and with less content of powdery silicon carbide. In the case of using the gel-like anhydrous silicic acid or hydrolysis product of silanes as the starting silicon source material, since the preparation thereof is conducted in an aqueous dispersion system, it is preferred to select one or more of water-soluble compounds of Fe, Co and Ni as the Fe, Co and Ni ingredients and cause them to be present in a state dissolved in the aqueous dispersion. It is also preferred to charge the starting silicon source material or starting mixture into the aqueous solution of the water-soluble compound of Fe, Co and Ni. Thereafter, it is preferred to adjust the pH of the aqueous dispersion or the aqueous solution to 6.5 to 8. By controlling the pH to higher than 6.5, the Fe, Co, Ni ingredients of the water-soluble compounds can effectively adsorbed to the surface of the starting material or mixture. That is, even if the excess water is removed by filtration, the fixing rate of the Fe, Co and Ni ingredients is not reduced and the load upon drying can be decreased. Further, by controlling the pH value to less than 8, it is possible to suppress the concentration of the alkali ingredient, for example, sodium ingredient in the case of sodium hydroxide used for the pH adjustment to such an extent as causing no undesired effect for the increase of the impurity concentration in the whiskers.

The starting mixture comprising the starting silicon source material and the carbonaceous material in which the content of the Fe, Co and Ni ingredients is thus adjusted, is formed into silicon carbide whiskers by heating reaction. The rate of silicon and carbon in the starting mixture may preferably be $3 \leq C/Si \leq 10$. In this case, while the reaction may be conducted in an atmosphere containing only the inert gas such as Ar, He, etc., it is desirable to conduct the reaction in such a gas atmosphere comprising, preferably, from 1 to 100% by volume, more preferably, from 1 to 75% by volume and, particularly preferably, from 5 to 75% by volume of a hydrogen gas and the remaining volume of an inert gas. Referring to the hydrogen gas used in this case, as the hydrogen concentration is higher, the yield of the resultant silicon carbide whiskers is better and the effect of suppressing the formation of powdery silicon carbide is increased. While on the other hand, if the hydrogen concentration is less than 1% by volume, no substantial effect of using the hydrogen gas can be obtained. However, if the hydrogen concentration is increased in excess of a certain level, hydrogen in the atmosphere may sometime react with carbon in the starting material into hydrocarbons to reduce the yield of the resultant silicon carbide. Accordingly, it is practically suitable to suppress the hydrogen concentration to less than 75% volume.

The effect of the hydrogen gas as described above is particularly significant in the case of using the hydrolysis products of chlorosilanes, chlorodisilanes, alkoxysilanes and alkoxydisilanes as the starting silicon source material by the reason as assumed below. The starting silicon source material of this type contains $\equiv$Si—H, $\equiv$Si—C, and $\equiv$Si—Si$\equiv$ bonds and they are decomposed in the course of elevating the temperature for the reaction, and high reactive silicon atoms obtained by the decomposition of the bonds are deactivated by adsorbing impurity gases in the atmosphere or gases discharged from the starting material if such hydrogen gas is not present. While on the other hand, if the hydrogen gas is present, the activated silicon maintains its high activity by the repeating adsorption and desorption with hydrogen, to deposit silicon carbide whiskers that are formed more easily than the powdery silicon carbide at a lower degree of saturation and this keeps the degree of saturation in the system from increasing and suppresses the formation of powdery products which require high saturation as the forming conditions.

In the process according to the present invention, the reaction between the starting silicon source material and the carbonaceous material is taken place at a high temperature. The heating temperature is preferably within a range from 1400° to 1700° C. in view of progressing the reaction advantageously and a more preferable ranges is from 1400° to 1600° C. Since the highly active silicon atoms in the starting material react effectively with carbon under the presence of $H_2$ gas, silicon carbide whiskers can be obtained at a higher yield and with less content of the powdery silicon carbide as compared with the conventional processes.

The thus obtained silicon carbide whiskers usually contain excess carbon and they can be purified to 99.0–99.5% by removing carbon when oxidized in air stream at 600° to 800° C., by which silicon carbide whiskers can be obtained at a high silicon carbide conversion ratio (silicon yield) of 70 to 90%. The silicon carbide whiskers are agglomeration products of short fibers with an aspect ratio from 10 to 200 and fiber diameter from 0.1 to 2.5 μm and with no orientation. They are granular in appearance and can be handled with ease like the powdery product. In addition, since the content of the powdery silicon carbide is extremely low, they can be fabricated with ease by existent molding technics such as pressure molding or extrusion molding. Furthermore, they are easily and uniformly mixed with powdery composite matrix material thereby providing a usefulness as short fibers for use in composite reinforcing material with ceramics, metals and plastics.

The present invention will be described more specifically referring to working examples and comparative examples, but it should be noted that this invention is no way restricted only to the examples below. The values for Fe, Co and Ni in the table show the content (ppm) per unit weight of specimens measured by emission spectroanalysis after treating the specimen with a mixed acid of hydrogen fluoride and nitric acid. In the case of the starting mixture comprising the starting silicon source material and the carbonaceous material, the values mean the concentration by weight (ppm) of the Fe, Co and Ni ingredients contained in the starting mixture based on the silicon ingredient in the starting silicon source material. Further, the yield means mol % for the yield based on the silicon.

EXAMPLE 1

60 g of commercially available silica gel was impregnated with 300 cc of an aqueous solution containing 0.011 g of $FeCl_3.6H_2O$, 0.015 g of $CoCl_2.6H_2O$ and 0.018 g of $NiCl_2.6H_2O$ dissolved therein and dried thoroughly with no filtration. 60 g of carbon black was sufficiently admixed with the silica gel to obtain a starting mixture.

The resultant starting mixture was reacted in an atmosphere comprising 75% argon and 25% hydrogen at 1600° C. for 2 hours and left for further 2 hours in an air stream at 800° C. for removing unreacted free carbon to obtain a reaction product.

The reaction product (silicon carbide whiskers) obtained was 34.8 g (yield, 83%), in which the content of powdery silicon carbide was as low as 1.2% when measured by an electron microscope connected with an image analyzing device. Further, the product was of β-type silicon carbide crystal when measured for the crystal type by X-ray diffractiometry.

The values for Fe, Co and Ni for the silica gel (commercial product), carbon black, starting mixture used and the reaction product are as shown in Table 1.

TABLE 1

|  | Fe | Co | Ni | Total |
|---|---|---|---|---|
| Silica gel | 50 | 1 | 5 | 56 |
| Carbon black | 10 | 3 | 1 | 14 |
| Starting mixture | 210 | 140 | 170 | 520 |
| Reaction product | 90 | 24 | 35 | 149 (ppm) |

EXAMPLES 2–14, COMPARATIVE EXAMPLES 1 and 2

After immersing 60 g of silicon oxide containing impurities in the amount shown in Table 2 with the catalyst by the amount shown in Table 3 in the same procedures as in Example 1, 60 g of carbon black containing the impurities by the amount shown in Table 2 was sufficiently mixed to obtain a starting mixture, which was reacted and applied with subsequent treatment by the same method as in Example 1 to obtain silicon carbide whiskers.

Table 3 also shows the starting mixture comprising silica gel and carbon black treated with the catalyst, the yield and the content of the powdery silicon carbide measured by an electron microscope connected with an image analyzing device for the reaction product (silicon carbide whiskers).

TABLE 2

|  | Al | Ca | Ti | Cu | Mg | Fe | Co | Zn | Ni |
|---|---|---|---|---|---|---|---|---|---|
| Silicon dioxide | 5 | 3 | N.D. | N.D. | N.D. | 1 | N.D. | N.D. | 1 |
| Carbon | 2 | 2 | N.D. | N.D. | N.D. | 3 | N.D. | 3 | N.D. (ppm) |

TABLE 3

| Examples | Catalyst addition amount (g) | | | Content in the starting mixture (ppm) | | | | Content in the reaction product (ppm) | | | Yield (%) | Content of powdery silicon carbide (%) |
|---|---|---|---|---|---|---|---|---|---|---|---|---|
|  | $FeCl_3.6H_2O$ | $CoCl_2.6H_2O$ | $NiCl_2.6H_2O$ | Fe | Co | Ni | Total | Fe | Co | Ni | | |
| 2 | 0.048 | 0.025 | 0.017 | 365 | 218 | 155 | 738 | 148 | 40 | 40 | 81 | 1.7 |
| 3 | 0 | 0.001 | 0.001 | 9 | 9 | 10 | 28 | 3 | 2 | 2 | 80 | 2.1 |
| 4 | 0.087 | 0 | 0 | 650 | 2 | 3 | 655 | 310 | N.D. | 1 | 82 | 1.6 |
| 5 | 0 | 0.048 | 0 | 8 | 430 | 3 | 441 | 1 | 69 | N.D. | 82 | 1.2 |
| 6 | 0 | 0 | 0.058 | 9 | 1 | 511 | 521 | 4 | N.D. | 140 | 83 | 1.3 |
| 7 | 0.005 | 0.054 | 0 | 43 | 480 | 2 | 525 | 21 | 85 | N.D. | 82 | 1.6 |
| 8 | 0 | 0.026 | 0.009 | 9 | 230 | 85 | 315 | 2 | 45 | 23 | 84 | 1.0 |
| 9 | 0.021 | 0 | 0.017 | 162 | 2 | 148 | 312 | 73 | 1> | 40 | 83 | 1.1 |
| 10 | 0.043 | 0.033 | 0.022 | 320 | 285 | 187 | 792 | 140 | 50 | 48 | 77 | 2.5 |
| 11 | 0.060 | 0.061 | 0.049 | 449 | 540 | 432 | 1421 | 186 | 89 | 101 | 71 | 6.8 |
| 12 | 0.065 | 0.033 | 0 | 477 | 291 | 3 | 771 | 203 | 49 | N.D. | 76 | 2.5 |
| 13 | 0.001 | 0.024 | 0.122 | 10 | 210 | 1085 | 1305 | 5 | 37 | 281 | 72 | 5.7 |
| 14 | 0.086 | 0.027 | 0 | 638 | 247 | 2 | 887 | 271 | 44 | 1 | 73 | 3.5 |
| Comparative Example 1 | 0.002 | 0 | 0 | 17 | 1 | 3 | 21 | 6 | N.D. | N.D. | 61 | 41 |
| Comparative Example 2 | 0.10 | 0.075 | 0.09 | 735 | 662 | 803 | 2200 | 321 | 126 | 309 | 67 | 7.6 |

EXAMPLE 15

One liter of hydrogen chloride at 10% concentration was reacted with 200 g of sodium silicate ($Na_2SiO_3$) to prepare an aqueous acid solution containing gel-like silicic acid dioxide and, after repeating filtration and water washing to adjust the pH of the aqueous solution to 7, dried to obtain powdery white starting silicon source material.

After immersing 60 g of the starting silicon source material with an aqueous solution containing 0.025 g of $FeCl_3.6H_2O$, 0.018 g of $CoCl_2.6H_2O$ and 0.018 g of $NiCl_2.6H_2O$ dissolved therein, they were dried and sufficiently mixed with 60 g of carbon black used in Example 1 to obtain a starting mixture, which was reacted in the same procedures as in Example 1 to obtain a reaction product (silicon carbide whiskers). Satisfactory results were obtained with the yield of 81% and the content of the powdery silicon carbide of 1.4%. The values for Fe, Co and Ni in the starting silicon source material and the starting mixture are as shown in Table 4.

TABLE 4

|  | Fe | Co | Ni | Total |
|---|---|---|---|---|
| Starting silicon material | 12 | 1 | N.D. | 13 |
| Starting mixture | 231 | 165 | 158 | 554 (ppm) |

EXAMPLE 16

After charging and hydrolyzing $(CH_3)_3Si_2Cl_3$ in purified water, it was sufficiently washed with water to obtain a starting silicon source material. After impregnating 62.2 g of the starting silicon source material with 300 cc of an aqueous solution containing 0.025 g of $FeCl_3.6H_2O$, 0.019 g of $CoCl_2.6H_2O$ and 0.018 g of $NiCl_2.6H_2O$ dissolved therein as the catalyst and drying, 60 g of carbon black as used in Example 1 was admixed therewith and silicon carbide whiskers were produced in the same procedures as in Example 1.

The reaction product (silicon carbide whiskers) were obtained by 35.6 g (86% yield) with the content of the powdery silicon carbide of 1.5%. The values for Fe, Co and Ni in the starting silicon source material and in the starting mixture comprising the starting silicon source material and the carbon black treated with catalyst, as well as the number of alkyl groups connected to silicon atoms per one silicon atom (R/Si) of the starting silicon source material are as shown in Table 5.

TABLE 5

|  | Fe | Co | Ni | Total | R/Si |
|---|---|---|---|---|---|
| Starting silicon material | 12 | 1 | N.D. | 13 | 1.45 |
| Starting mixture | 251 | 181 | 162 | 494 (ppm) | — |

EXAMPLE 17

Silicon carbide whiskers were produced in the same procedures as in Example 16 except for impregnating 65.7 g of starting silicon source material obtained by hydrolyzing a mixture of $(CH_3)_4Si_2Cl_2$, $(CH_3)_3SiCl_3$ and $CH_3SiCl_3$ in 2:2:1 ratio in the same manner as in Example 16, with 300 cc of an aqueous solution containing, as a catalyst, 0.03 g of $FeCl_3.6H_2O$, 0.019 g of $CoCl_2.6H_2O$ and 0.019 g of $NiCl_2.6H_2O$ dissolved therein. The yield was 81% and the content of the powdery silicon carbide was 1.6%.

The values for the Fe, Co and Ni in the starting silicon source material and in the starting mixture, as well as the value for the R/Si ratio in the starting silicon source material are as shown in Table 6.

TABLE 6

|  | Fe | Co | Ni | Total | R/Si |
|---|---|---|---|---|---|
| Starting silicon material | 8 | N.D. | 2 | 10 | 1.60 |
| Starting mixture | 263 | 172 | 170 | 603 (ppm) | — |

EXAMPLES 18-27

Mixtures of various silanes shown in Table 7 were prepared and each 100 g of the respective mixtures was poured into 1 liter of pure water to synthesize hydrolysis product. In the case of alkoxysilane or alkoxydisilanes, hydrolysis was conducted by adding several drops of 10% aqueous ammonia solution for increasing the hydrolyzing rate. 0.03 g of $FeCl_3.6H_2O$ was added and vigorously stirred into an aqueous suspension of the resultant hydrolysis products of various silanes. Further, an aqueous 1N sodium hydroxide solution was gradually dropped to adjust pH to 7.3 to 7.7 and stirred for 15 minutes.

An aqueous suspension of the hydrolysis products was filtered and the cake was further washed with water, filtered and then dried to obtain a starting silicon source material mainly composed of silicon and oxygen.

The resultant various silicon source starting material and various hydrolysis products before the addition of $FeCl_3.6H_2O$ were respectively subjected to emission spectroanalysis to measure the Fe content and calculate the Fe fixing ratio. The fixing ratio was 96 to 99% as shown in Table 7.

40 g of carbon black was sufficiently mixed with the starting silicon source material to obtain a starting mixtures.

The starting mixture was reacted in an atmosphere comprising 75% argon and 25% hydrogen at 1600° C. for 2 hours and further left in an air stream at 800° C. for 2 hours for removing unreacted free carbon to obtain reaction product. The results as shown in Table 7 were obtained.

TABLE 7

| Examples | Silanes Composition formula | Molar ratio | R/Si | Fe fixing ratio in the hydrolysis product (%) | Concentration in the mixture Fe | Co | Ni | Yield (%) | Powdery silicon carbide content (%) |
|---|---|---|---|---|---|---|---|---|---|
| 18 | $HSiCl_3$, $CH_3SiCl_3$ | 1:4 | 1 | 96 | 325 | <1 | <1 | 85 | 1.4 |
| 19 | $SiCl_4$, $CH_3SiCl_3$ | 1:1 | 0.50 | 99 | 358 | <1 | <1 | 86 | 1.3 |
| 20 | " | 2:1 | 0.33 | 98 | 362 | 1 | 1 | 83 | 1.3 |
| 21 | $CH_2=CHSiCl_3, SiCl_4$ | 1:2 | 0.33 | 98 | 373 | 1 | <1 | 81 | 1.6 |

TABLE 7-continued

| Examples | Silanes Composition formula | Molar ratio | R/Si | Fe fixing ratio in the hydrolysis product (%) | Concentration in the mixture | | | Yield (%) | Powdery silicon carbide content (%) |
|---|---|---|---|---|---|---|---|---|---|
| | | | | | Fe | Co | Ni | | |
| 22 | ⌬—SiCl₃, SiCl₄ | 1:2 | 0.33 | 97 | 402 | 1 | 1 | 80 | 2.1 |
| 23 | HSi(OCH₃)₃, Si(OCH₃)₄ | 1:3 | 0.25 | 97 | 313 | <1 | <1 | 88 | 1.8 |
| 24 | CH₂AD,4 CHSi(OCH₃)₃, Si(OCH₃)₄ | 1:2 | 0.33 | 99 | 334 | <1 | <1 | 85 | 1.0 |
| 25 | ⌬—Si(OCH₃)₃, Si(OCH₃)₄ | 1:3 | 0.25 | 98 | 358 | <1 | <1 | 84 | 1.5 |
| 26 | CH₃<br>\|<br>HSi(OCH₂CH₃)₂, CH₃Si(OCH₃)₃, Si(OCH₂CH₃)₄ | 1:2:3 | 0.67 | 96 | 369 | <1 | <1 | 86 | 1.9 |
| 27 | (CH₃)₂Si₂(OCH₃)₄, (CH₃)₃Si₂(OCH₃)₃, CH₃Si(OCH₃)₃ | 1:1:2 | 1.17 | 96 | 245 | <1 | <1 | 88 | 1.9 |

EXAMPLE 28

Silicon carbide whiskers were produced in the same procedures as in Example 1 excepting for changing the reaction temperature as shown in Table 8. As a result, the silicon carbide whiskers obtained were as shown in Table 8.

TABLE 8

| Reaction temperature (°C.) | Yield (%) | Powdery silicon carbide content (%) |
|---|---|---|
| 1420 | 76 | 2.7 |
| 1620 | 87 | 4.5 |

EXAMPLE 29

Silicon carbide whiskers were produced in the same procedures as in Example 1 except for reaction in a mixed atmosphere of 90% Ar and 10% H₂.

As the result, silicon carbide whiskers were obtained at a yield of 80% with the powdery silicon carbide content of 2.2%.

COMPARATIVE EXAMPLE 3

6 g of silicon dioxide and 6 g of carbon shown in Table 2 were sufficiently mixed to obtain a starting mixture. The starting material was reacted in an atmosphere comprising 75% argon and 25% hydrogen at 1600° C. for 2 hours and applied with the same treatment as in Example 1 to obtain 3.5 g of powder. When the powder was measured under an electron microscope, the product was substantially composed of powder containing little whiskers. Further, as a result of X-ray diffractiometry, they also show the β-type silicon carbide pattern like that in other experiments.

COMPARATIVE EXAMPLE 4

Silicon carbide whiskers were produced in the same procedures as in Example 2 except for using the starting material as shown in Table 2, and using aqueous solution of respective elements such that the elements of the kind and the amount shown in Table 9 were contained as the catalyst.

The yield and the powdery silicon carbide content of the resultant silicon carbide whiskers are also shown in Table 9.

TABLE 9

| | K | Ca | V | Cr | Mn | Cu | Zn | Ag | Zr | Y |
|---|---|---|---|---|---|---|---|---|---|---|
| Content to silica gel (ppm) | 325 | 313 | 337 | 305 | 318 | 331 | 322 | 338 | 317 | 341 |
| Yield (%) | 47 | 45 | 33 | 39 | 48 | 41 | 40 | 28 | 31 | 38 |
| Content of powdery silicon carbide (%) | 88 | 82 | 95 | 100 | 90 | 100 | 91 | 100 | 89 | 78 |

In the process according to the present invention, since the starting mixture comprising the starting silicon source material mainly composed of silicon and oxygen and the carbonaceous material is reacted at a high temperature, it is excellent in the productivity such as the amount of silicon carbide whiskers produced per volume of the reaction chamber is great and, accordingly, they can be produced by a compact production facility. Further, since it is only necessary to uniformly mix the starting silicon source material and the carbonaceous material and heat the starting mixture at a high temperature, it is excellent in the operationability. In addition, since a specific amount of the Fe, Co and Ni ingredients are incorporated into the starting mixture, silicon carbide whiskers can be produced at high yield while suppressing the content of the powdery silicon carbide as apparent from the results shown in Tables 3 and 7. Particularly, it can be recognized that silicon carbide whiskers with less content of powdery silicon carbide can be produced at an extremely high yield by incorporating one or more of Fe, Co and Ni ingredients to the starting mixture comprising the starting silicon source material and the carbonaceous material such that the total amount of the Fe, Co and Ni ingredients is from 25 to 750 ppm based on the silicon ingredient in the starting silicon source material.

Furthermore, in the process according to the present invention, gel-like anhydrous silicic acid obtained by adding an inorganic acid to a silicate as shown in Example 15, or hydrolysis products obtained by hydrolyzing specific chlorosilanes, chlorodisilanes, alkoxysilanes and alkoxydisilanes as shown in Examples 16 to 27 can be used as suitable starting silicon source material. Among all, it has been recognized that silicon carbide whiskers can be obtained at a higher yield by controlling the number of hydrogen atoms and/or monovalent hydrocarbon groups connected to silicon atoms per one silicon atom in the hydrolysis products (R/Si) within a range from 0 to 2.

What is claimed is:

1. A process for producing silicon carbide whiskers comprising reacting a starting mixture consisting essentially of a starting silicon source material composed predominantly of silicon and oxygen, and a carbonaceous material at a temperature of 1400° to 1700° C., said starting mixture containing one or more of Fe, Co and Ni ingredients such that the total amount of said Fe, Co and Ni ingredients is from 25 to 2000 ppm based on the silicon ingredient in the starting silicon source material.

2. A process as defined in claim 1, wherein the starting silicon source material is a gel-like anhydrous silicic acid prepared by adding an inorganic acid to a silicate.

3. A process as defined in claim 2, wherein the starting mixture consisting essentially of the starting silicon material and the carbonaceous material is prepared by adding an inorganic acid to a uniform mixture of a silicate and the carbonaceous material thereby converting the silicate in said mixture into a gel-like anhydrous silicic acid.

4. A process as defined in claim 1, wherein the starting silicon source material is a hydrolysis product of one or more of silanes selected from the group consisting of chlorosilanes represented by the general formula:

$$R_aSiCl_{4-a}$$

where R represents a hydrogen atom or a monovalent hydrocarbon group and a is an integer from 0 to 3 and chlorodisilanes represented by the general formula:

$$R_bSi_2Cl_{6-b}$$

where R represents a hydrogen atom or a monovalent hydrocarbon group and b is an integer from 1 to 5.

5. A process as defined in claim 4, wherein the starting mixture consisting essentially of the starting silicon source material and the carbonaceous material is a uniform mixture of a hydrolysis product of silanes and a carbonaceous material obtained by adding water to a mixture in which the carbonaceous material is uniformly dispersed in one or more of silanes selected from the group consisting of chlorosilanes represented by the general formula:

$$R_aSiCl_{4-a}$$

where R represents a hydrogen atom or a monovalent hydrocarbon group and a is an integer from 0 to 3 and chlorodisilanes represented by the general formula:

$$R_bSi_2Cl_{6-b}$$

where R represents a hydrogen atom or a monovalent hydrocarbon group and b is an integer from 1 to 5.

6. A process as defined in claim 1, wherein the starting silicon source material is a hydrolysis product of one or more of silanes selected from the group consisting of alkoxysilanes represented by the general formula:

$$R_aSi(OR')_{4-a}$$

where R represents a hydrogen atom or a monovalent hydrocarbon group, R' represents a monovalent hydrocarbon group and a is an integer of 0 to 3 and alkoxydisilanes represented by the general formula:

$$R_bSi_2(OR')_{6-b}$$

where R represents a hydrogen atom or a monovalent hydrocarbon group, R' represents a monovalent hydrocarbon group and b is an integer of 1 to 5.

7. A process as defined in claim 6, wherein the starting mixture consisting essentially of the starting silicon source material and the carbonaceous material is a uniform mixture of a hydrolysis product of silanes and the carbonaceous material obtained by adding water to a mixture in which the carbonaceous material is uniformly dispersed in one or more of silanes selected from the group consisting of alkoxysilanes represented by the general formula:

$$R_aSi(OR')_{4-a}$$

where R represents a hydrogen atom or a monovalent hydrocarbon group, R' represents a monovalent hydrocarbon group and a is an integer from 0 to 3 and alkoxydisilanes represented by the general formula:

$$R_bSi_2(OR')_{6-b}$$

where R represents a hydrogen atom or a monovalent hydrocarbon group, R' represents a monovalent hydrocarbon group and b is an integer from 1 to 5.

8. A process as defined in claim 4, wherein the hydrolysis product of the silanes is a compound in which the number of hydrogen atoms and/or monovalent hydrocarbon groups connected to silicon atoms per one silicon atom (R/Si) is from 0 to 2.

9. A process as defined in claim 6, wherein the hydrolysis product of the silanes is a compound in which the number of hydrogen atoms and/or monovalent hydrocarbon groups connected to silicon atoms per one silicon atom (R/Si) is from 0 to 2.

10. A process as defined in claim 1, wherein one or more of compounds selected from Fe, Co and Ni and the starting silicon source material composed predominately of silicon and oxygen or a starting mixture of said starting silicon source material and the carbonaceous material are mixed in water and, thereafter, the pH of the resultant aqueous suspension is adjusted to 6.5-8.

11. A process as defined in claim 10, wherein the compound of Fe, Co and Ni is a water-soluble compound.

12. A process as defined in claim 1, wherein the total amount of the Fe, Co and Ni ingredients is from 25 to 750 ppm based on the silicon ingredient.

13. A process as defined in claim 1, wherein the starting mixture consisting essentially of the starting silicon source material and the carbonaceous material is reacted in a hydrogen gas or in a gas atmosphere comprising a hydrogen gas and an inert gas.

* * * * *